US010163943B2

(12) United States Patent
Yamamoto et al.

(10) Patent No.: US 10,163,943 B2
(45) Date of Patent: *Dec. 25, 2018

(54) DISPLAY DEVICE

(71) Applicant: Japan Display Inc., Tokyo (JP)

(72) Inventors: Koji Yamamoto, Tokyo (JP); Tatsuya Ishii, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/912,672

(22) Filed: Mar. 6, 2018

(65) Prior Publication Data

US 2018/0197893 A1     Jul. 12, 2018

Related U.S. Application Data

(63) Continuation of application No. 15/333,377, filed on Oct. 25, 2016, now Pat. No. 9,941,306.

(30) Foreign Application Priority Data

Dec. 4, 2015   (JP) ................................ 2015-237251

(51) Int. Cl.
*G09G 5/00*      (2006.01)
*H01L 27/12*    (2006.01)
(Continued)

(52) U.S. Cl.
CPC ....... *H01L 27/1244* (2013.01); *G09G 3/3266* (2013.01); *G09G 3/3648* (2013.01);
(Continued)

(58) Field of Classification Search
CPC .......... G09G 3/3677; G09G 2330/021; G09G 2300/0426; G09G 2310/08;
(Continued)

(56) References Cited

U.S. PATENT DOCUMENTS 7,358,563 B2   4/2008 Lee
7,453,420 B2 * 11/2008 Watanabe ......... G02F 1/136204
345/100

(Continued)

FOREIGN PATENT DOCUMENTS

JP        2009037124 A    2/2009
WO    2010/147032 A1   12/2010

*Primary Examiner* — Duc Q Dinh
(74) *Attorney, Agent, or Firm* — Typha IP LLC

(57) ABSTRACT

To make the dimension of an electrostatic protection circuit small with the same maintained high in sensitivity. The electrostatic protection circuit is of the configuration that a first diode and a second diode are connected in series, wherein a semiconductor layer owned by each diode is configured to be sandwiched between a gate electrode and a conductive light shielding film. The light shielding film is formed to overlap with the semiconductor layer and has a wider area than the semiconductor layer. This results in having a gate covering the semiconductor layer from an upper side and a back gate covering the semiconductor layer from a lower side, so that the sensitivity can be maintained high irrespective of decreasing the electrostatic protection circuit in dimension.

11 Claims, 6 Drawing Sheets

(51) Int. Cl.
    *G09G 3/3266*     (2016.01)
    *G09G 3/36*     (2006.01)
    *H01L 27/02*     (2006.01)
    *H01L 29/786*     (2006.01)

(52) U.S. Cl.
    CPC ......... *G09G 3/3677* (2013.01); *G09G 3/3696* (2013.01); *H01L 27/0255* (2013.01); *H01L 29/78633* (2013.01); *H01L 29/78648* (2013.01); *G09G 2310/0286* (2013.01); *G09G 2330/04* (2013.01)

(58) Field of Classification Search
    CPC ... G09G 2310/0291; G09G 2310/0297; G09G 2320/0233; G09G 2320/043; G09G 3/2092; G09G 2330/04; H01L 27/0248; H01L 27/0285; H01L 27/0288; H01L 29/7408; H01L 2223/6611; H01L 2224/81903; H01L 24/83
    USPC .................................................. 345/98–100
    See application file for complete search history.

(56) References Cited

U.S. PATENT DOCUMENTS

| | | | |
|---|---|---|---|
| 7,456,909 B2 | 11/2008 | Park | |
| 7,629,614 B2 | 12/2009 | Liao | |
| 8,085,352 B2 * | 12/2011 | Kim | H01L 27/0248 349/40 |
| 9,013,846 B2 * | 4/2015 | Duan | G02F 1/136204 361/56 |
| 2008/0106835 A1 | 5/2008 | Ker et al. | |
| 2012/0087460 A1 | 4/2012 | Morikawa | |
| 2015/0115271 A1 | 4/2015 | Yoon et al. | |

\* cited by examiner

B-B

C-C

DISPLAY DEVICE

CROSS-REFERENCE TO RELATED APPLICATIONS

This application is a continuation of U.S. patent application Ser. No. 15/333,377 filed on Oct. 25, 2016. Further, this present application claims priority from Japanese Patent Application JP 2015-237251 filed on Dec. 4, 2015, the contents of which are hereby incorporated by reference into this application.

BACKGROUND OF THE INVENTION

(1) Field of the Invention

The present invention relates to a display device and particularly, to a display region capable of forming an electrostatic protection circuit in a narrow region.

(2) Description of the Related Art

In liquid crystal display devices being one kind of display devices, there are arranged a TFT substrate on which pixels having pixel electrodes and thin film transistors (TFTs) are formed in a matrix fashion, and an opposite substrate facing the TFT substrate, and a liquid crystal layer is provided with itself between the TFT substrate and the opposite substrate. Then, an image is formed by controlling the transmission factors of light through liquid crystal molecules on a pixel-by-pixel basis.

The liquid crystal display device is formed with a TFT for each of the pixels, and a scanning line drive circuit and the like having many TFTs is formed outside the display region. When static electricity invades from outside, a TFT is destroyed by the static electricity to cause the liquid crystal display device fall in failure. In order to prevent this, there is arranged an electrostatic protection circuit. The electrostatic protection circuit is called ESD (Electro Static Discharger) in some cases. International Application Publication WO-A1-2010147032 describes a configuration that uses resistances and diodes for the ESD circuit in a display device. Further, Japanese Patent Application Publication No. 2009-37124 A1 discloses a display device with an electrostatic protection circuit.

In liquid crystal display devices of medium to small sizes, it has been strongly requested to make the size of a display region large with the external size remained small. If such is done, a frame region outside the display region becomes small. On one hand, an electrostatic protection circuit is essential for the protection of TFTs used in the liquid crystal display device. In order to maintain the sensitivity of the electrostatic protection circuit high, a certain degree of size is required for the TFTs used in the electrostatic protection circuit.

On the other hand, the electrostatic protection circuit is formed in a frame region, and thus, for a small frame region, it is necessary to make small the area used for the electrostatic protection circuit. However, there arises a dilemma that making the area occupied by the electrostatic protection circuit small generally results in lowering the sensitivity of the electrostatic protection circuit.

SUMMARY OF THE INVENTION

Therefore, it is an object of the present invention to realize a configuration in which with the sensitivity of an electrostatic protection circuit maintained high, the area occupied by the electrostatic protection circuit can be reduced so that a frame region of a display device can be made to be small. It is to be noted that the problem like this equally exists not only in liquid crystal display devices but also in organic EL (electroluminescence) display devices using many TFTs.

The present invention has been made to overcome the foregoing problem and typically takes the following configuration. That is, the present invention is directed in one aspect to a display device having an electrostatic protection circuit which is of a configuration that a first diode and a second diode are connected in series between a first connection wire with a first power source voltage applied and a second connection wire with a second power source voltage applied and in which between the first and second diodes, a third connection wire connected to the first and second diodes is formed and is provided with a first terminal and a second terminal. The first diode has a first semiconductor layer, a first gate electrode and a conductive first light shielding film, the first gate electrode is connected to the third connection wire, and the first light shielding film is formed, as viewed in a plan view, to extend to an overlapping position with the third connection wire and is formed in an overlapping relation with the semiconductor layer to possess a wider area than the semiconductor layer. The second diode has a second semiconductor layer, a second gate electrode and a conductive second light shielding film, the second gate electrode is connected to the second connection wire, and the second light shielding film is formed, as viewed in a plan view, to extend to an overlapping position with the second connection wire and is formed in an overlapping relation with the semiconductor layer to possess a wider area than the semiconductor layer.

BRIEF DESCRIPTION OF THE DRAWINGS

A non-limiting and non-exhaustive embodiment of the present invention will be described with reference to the following drawings, wherein like reference numerals refer to like or corresponding parts throughout various views unless otherwise specified.

DETAILED DESCRIPTION OF THE PREFERRED EMBODIMENT

Hereafter, the present invention will be described in detail based on an embodiment. It is to be noted that although the following embodiment will be described by taking a liquid crystal display device as an example, the present invention will be applicable also to an organic EL (electroluminescence) display device.

First Embodiment

Figure 1:
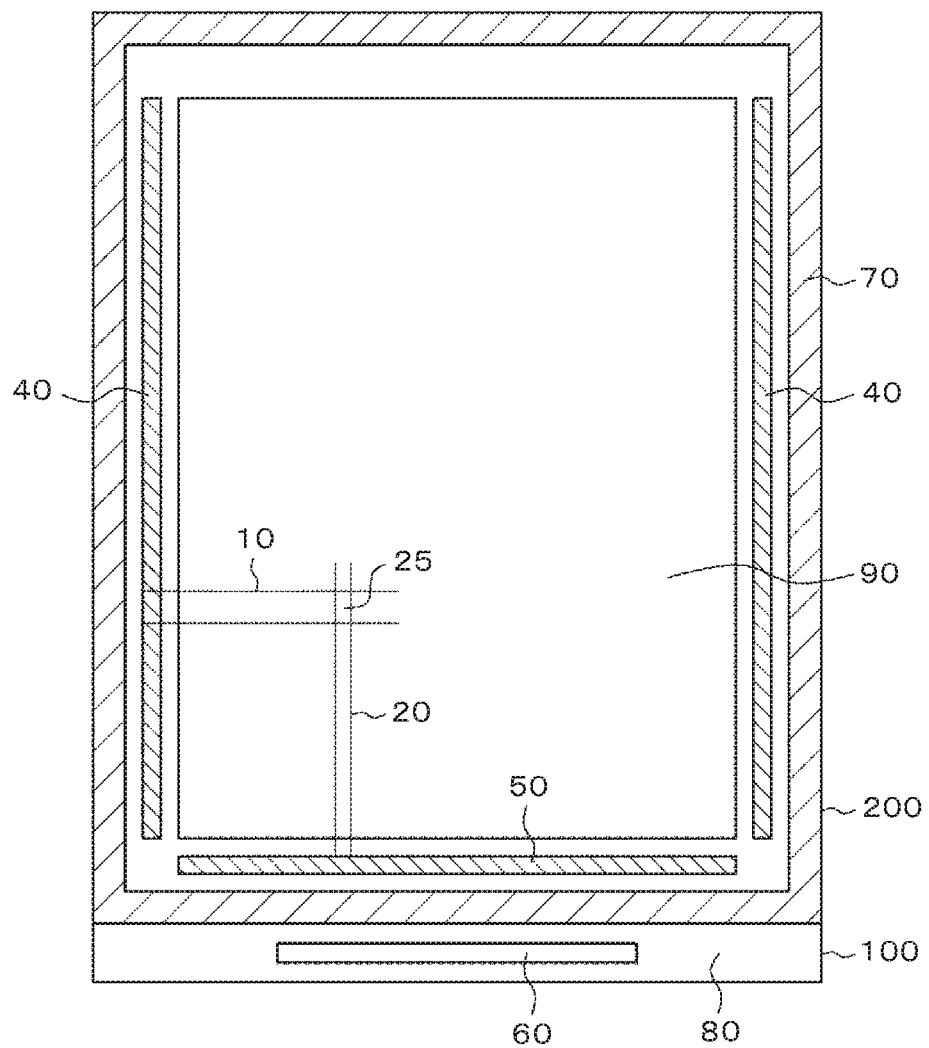
FIG. 1 is a plan view of a liquid crystal display device to which the present invention is applied.

FIG. 1 is a plan view of a liquid crystal display panel used in a liquid crystal display device to which the present invention is applied. In a display region 90 shown in FIG. 1, scanning lines 10 extend in a transverse direction and are arrayed in a longitudinal direction, while video signal lines 20 extend in the longitudinal direction and are arrayed in the transverse direction. Each region surrounded by the scanning lines 10 and the video signal lines 20 constitutes a pixel 25. In FIG. 1, the scanning lines 10 and the video signal lines 20 are formed on a TFT substrate 100. An opposite substrate 200 is disposed to face the TFT substrate 100, and the TFT substrate 100 and the opposite substrate 200 are adhered to each other by means of a sealing compound 70 at their peripheral parts, inside which a liquid crystal layer is contained. The TFT substrate 100 is formed to be larger than the opposite substrate 200, and at the portion where the TFT substrate 100 alone exists as a single piece, a terminal section 80 is formed, on which a wiring is formed to supply the liquid crystal display panel with electric power, video signals and the like and on which a drive IC 60 is arranged. Further, a flexible printed wiring substrate is connected to an end part of the terminal section 80 for supplying power source, signals and the like.

In FIG. 1, the outside of the display region 90 is defined as a frame region. The frame region of the TFT substrate 100 is formed with an electrostatic protection circuit 50, a scanning line drive circuit 40 and the like. Although in FIG. 1, for better understanding, the electrostatic protection circuit 50, the scanning line drive circuit 40 and the like are arranged on the side closer to the display region 90 side than the sealing compound 70, it is often the case in actual products that these circuits are formed to be overlapped with the sealing compound 70. Many wires formed between the terminal section 80 and the display region 90 are omitted in FIG. 1 for brevity in illustration.

In FIG. 1, the scanning line drive circuit 40 is formed outside the both long sides of the display region 90. The electrostatic protection circuit 50 is arranged at the side that is on the terminal section 80 side. Although it is often the case that the electrostatic protection circuit 50 is arranged to be concentrated at the side on the terminal section 80 side, the electrostatic protection circuit 50 may be arranged at another side in some cases. The present invention is also applicable to the case where the electrostatic protection circuit 50 is arranged outside of another side of the display region 90.

Although liquid crystal display devices involve a problem in terms of the viewing angle, a panel of the IPS (In-Plane-Switching) mode possesses an excellent viewing angle characteristics. The following description will be made taking a liquid crystal display device of the IPS mode as an example. However, it is needless to say that the present invention is also applicable to liquid crystal display devices of other modes such as, for example, TN (Twisted Nematic), VA (Vertical Alignment) and the like.

Figure 2:
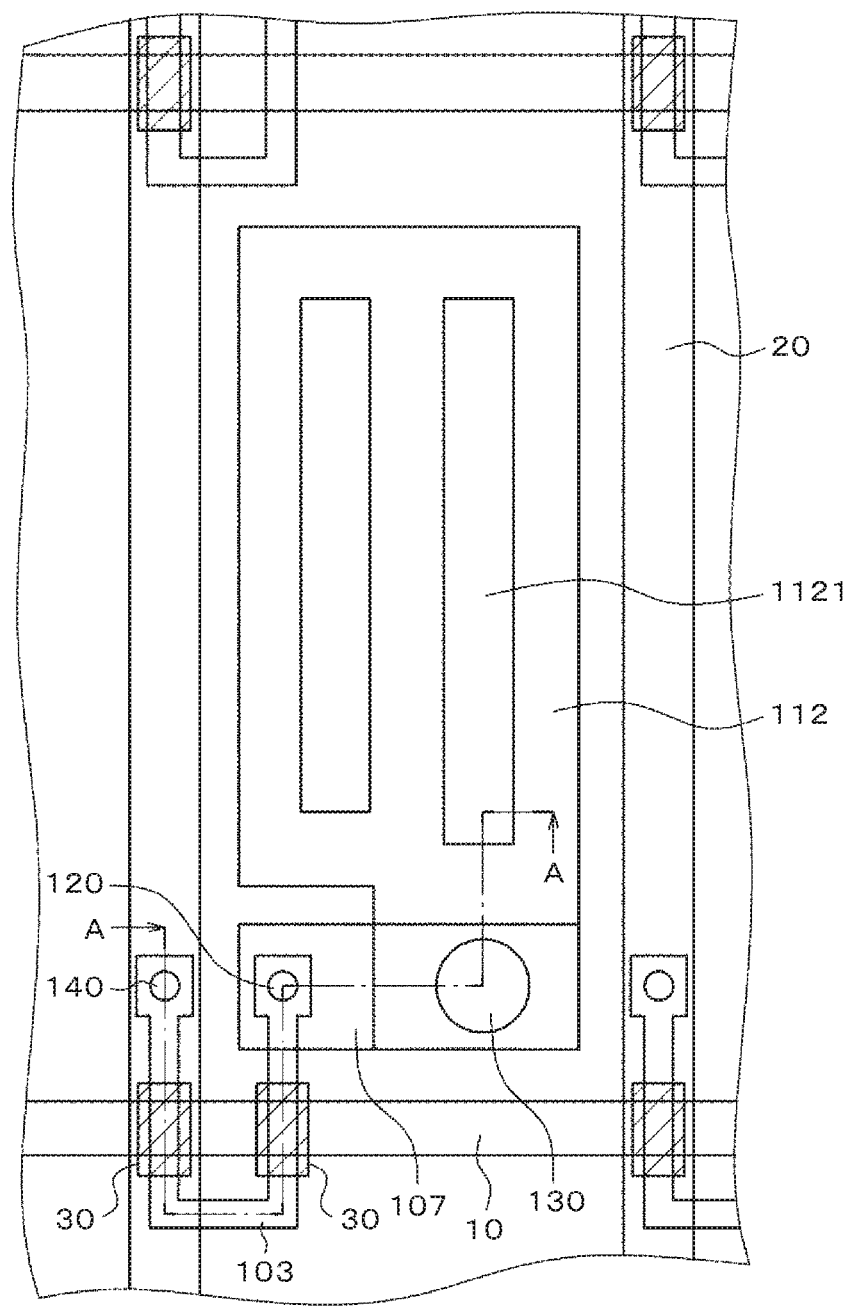
FIG. 2 is a plan view showing the configuration of a pixel in a display region of the liquid crystal display device.

FIG. 2 is a plan view showing an example of a pixel in the liquid crystal display device of the IPS mode. There are various kinds of configurations in the IPS mode, and FIG. 2 shows a plan view of the pixel configuration of a so-called FFS (Fringe Field Switching) mode belonging to the IPS mode. In FIG. 2, the scanning lines 10 extend in the transverse direction and are arrayed in the longitudinal direction, while the video signal lines 20 extend in the vertical direction and are arrayed in the transverse direction. A pixel electrode 112 is formed at each region surrounded by the scanning lines 10 and the video signal lines 20.

In FIG. 2, a configuration is taken that a semiconductor layer 103 extends in a U-shape from a through hole 140 to pass twice under the scanning line 10. Portions at which the semiconductor layer 103 passes across the scanning line 10 are configured as TFTs. That is, at these portions, the scanning line 10 constitutes gate electrodes. The semiconductor layer 103 is connected to a contact electrode 107 at a through hole 120, and the contact electrode 107 is connected to the pixel electrode 112 at a through hole 130. The pixel electrode 112 is configured as a comb-tooth electrode with slits 1121 inside.

The portions at which the semiconductor layer 103 passes across the gate electrode (i.e., scanning line) 10 constitute channel regions of the TFTs. When these regions are lighted by a backlight, photoelectric current is generated to make it unable to hold the video signal. To prevent this, light shielding films 30 are formed at these portions not to let the light from the backlight reach the channel regions of the semiconductor layer 103.

Figure 3:
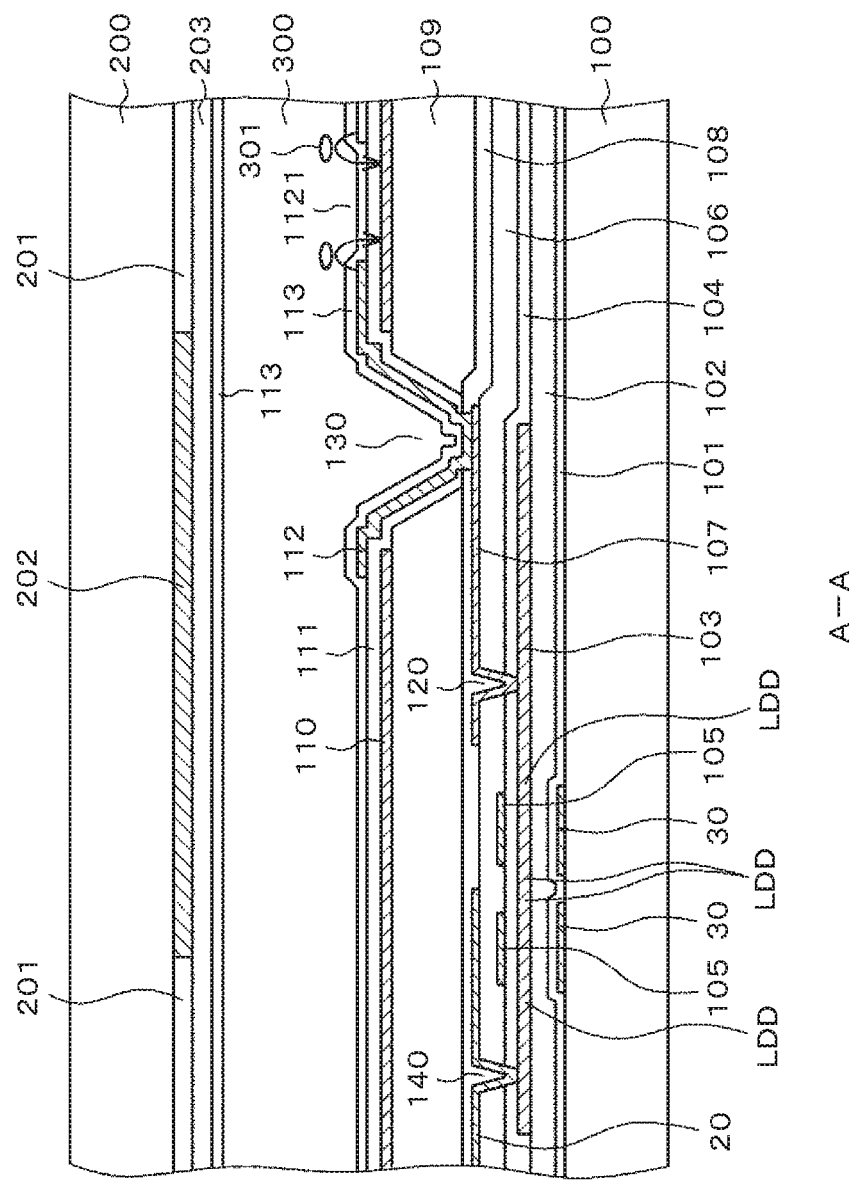
FIG. 3 is a sectional view of a pixel part, taken along the line A-A in FIG. 2.

FIG. 3 is a sectional view taken along the line A-A in FIG. 2. The TFT in FIG. 3 is a so-called top gate type TFT and uses LTPS (Low Temperature Poly-Silicon) as the semiconductor. In FIG. 3, in the first place, light shielding films 30 of a metal such as, for example, Mo or the like are formed at portions corresponding to channel regions of TFTs to be formed thereafter. Because being sufficient to be able to shield light, the metal is 50 nm (nanometers) or so in thickness. Besides metals, the light shielding films 30 may be of an alloy such as MoW or the like or may each be of a laminated film thereof. Further, the light shielding films 30 may be the same laminated configuration as the gate electrodes, the scanning lines or the video signal lines. However, it is required that the light shielding films 30 each be an electric conductor as a whole.

Then, a first backing (foundation) film 101 made of SiN and a second backing film 102 made of $SiO_2$ are formed on the light shielding films 30 and a glass substrate 100 by a CVD (Chemical Vapor Deposition) method. The roles of the first backing film 101 and the second backing film 102 are to prevent a semiconductor layer 103 from being contaminated by impurities from the glass substrate 100. For example, the first backing film 101 is 20 nm in thickness, and the second backing film 102 is 200 nm in thickness.

The semiconductor layer 103 for constituting TFTs is formed on the second backing film 102. This semiconductor layer 103 is formed in such a way that first, an a-Si film is formed by a CVD method on the second backing film 102 and then, is converted into a poly-Si film by being subjected to a laser annealing process. The poly-Si film is patterned by photolithographic technique.

A gate insulating film 104 is formed on the semiconductor layer 103. This insulating film 104 is a $SiO_2$ film formed using TEOS (Tetraethoxysilane). This film 104 is also formed by a CVD method. The gate electrodes 105 are formed on the insulating film 104. The scanning line 10 shown in FIG. 2 doubles as the gate electrodes 105. Because the semiconductor layer 103 passes under the scanning line 10 twice, two gate electrodes 105 are arranged. The gate electrodes 105 are each formed using a MoW film, for example.

The gate electrodes 105 are patterned by photolithographic technique. In patterning, an impurity like phosphorus, boron or the like is doped into the poly-Si layer by ion implantation process to form a source S or a drain D on the poly-Si layer. Further, in patterning the gate electrodes 105, photoresist is utilized to form LDD (Lightly Doped Drain) layers between the channel layer and the source or drain of the poly-Si layer. This is to prevent the electric field intensity from becoming large locally. Forming the LDDs like this is equally applied to TFTs in the electrostatic protection circuit referred to later.

Thereafter, an interlayer insulating film 106 is formed using $SiO_2$ to cover the gate electrodes 105. The interlayer insulating film 106 is to insulate the gate electrodes 105 from the contact electrode 107. In the interlayer insulating film 106 and the gate insulating film 104, the through hole 120 is formed connecting the semiconductor layer 103 to the contact electrode 107. The through hole 120 is formed by photolithographic technique simultaneously in the interlayer insulating film 106 and the gate insulating film 104.

The video signal lines 20 are formed on the interlayer insulating film 106. Each video signal line 20 is connected at the through hole 140 to the semiconductor layer 103. That is, this means that two TFTs are formed between the through hole 140 and the through hole 120. The interlayer insulating film 106 has thereon the contact electrode 107 in the same layer as the video signal line 20. The contact electrode 107 is connected to the pixel electrode 112 through the through hole 130. The video signal line 20 and the contact electrode 107 are made using MoW, for example. Where the video signal line 20 is required to be lowered in resistance, there may be used a laminated film with an Al-alloy film sandwiched in two MoW films and the like.

An inorganic passivation film 108 is formed using SiN or the like to cover the video signal line 20 and the contact electrode 107 and thus, covers the whole of the TFTs. Like the first backing film 101 and the like, the inorganic passivation film 108 is formed by a CVD method. Incidentally, the formation of the inorganic passivation film 108 may be omitted depending on products. An organic passivation film 109 is formed to cover the inorganic passivation film 108. The organic passivation film 109 is formed using photosensitive acrylic resin. Besides using photosensitive acrylic resin, the organic passivation film 109 can also be formed using silicon resin, epoxy resin, polyamide resin or the like. The organic passivation film 109 is formed to be thick because of having a role as a flattening film. The film thickness of the organic passivation film 109 is in a range of 1 to 4 µm and, in most cases, is 2 µm or so.

For electrical continuity of the pixel electrode 112 to the contact electrode 107, the through hole 130 is formed in the inorganic passivation film 108 and the organic passivation film 109. Photosensitive resin is used as the organic passivation film 109. After being applied, the photosensitive resin is exposed to light, so that only portions shined by the light dissolve in a specified developing solution. That is, by using the photosensitive resin, the formation of photoresist can be omitted. After the formation of the through hole 130 in the organic passivation film 109, the organic passivation film 109 is baked at the temperature of 230° C. or so, whereby the organic passivation film 109 is completed.

Thereafter, ITO (Indium Tin Oxide) becoming a common electrode 110 is formed by sputtering, and patterning is carried out to remove the ITO from the through hole 130 and from around the through hole 130. The common electrode 110 can be formed to a flat shape to be common to respective pixels. Then, SiN becoming a capacitive insulating film 111 is formed over the entire surface by a CVD method. Then, in the through hole 130, a through hole that makes electrical continuity of the contact electrode 107 to the pixel electrode 112 is formed in the capacitive insulating film 111 and the inorganic passivation film 108. Incidentally, the capacitive insulating film 111 is used to form a holding capacitor between the common electrode 110 and the pixel electrode 112 and thus, is called like this.

Subsequently, ITO is formed by sputtering and then, is subjected to patterning to form the pixel electrode 112. The planar shape of the pixel electrode 112 is as illustrated in FIG. 2. Alignment film material is applied onto the pixel electrode 112 by a flexographic printing method, an ink-jet printing method or the like and is then baked to form an alignment film 113. For the alignment treatment of the alignment film 113, there may be used a photo-alignment control using polarized ultraviolet rays besides a rubbing method.

When a voltage is applied between the pixel electrode 112 and the common electrode 110, lines of electric force are generated. Liquid crystal molecules 301 are turned as shown in FIG. 3 under an electric field generated by the lines of electric force, and the quantity of light passing through a liquid crystal layer 300 is controlled on a pixel-by-pixel basis to form an image.

In FIG. 3, the opposite substrate 200 is arranged with the liquid crystal layer 300 placed thereunder. A color filter layer is formed inside the opposite substrate 200. The color filter layer has red, green and blue color filter parts 201 regularly assigned to respective pixels, so that color images can be formed. A black matrix 202 also included in the color filter layer is interposed between every two adjoining color filter parts 201 of the color filter layer to enhance contrast in image. The black matrix 202 has a role as a light shielding film against light from outside to the TFT and prevents photoelectric current from flowing through the TFT.

An overcoat film 203 is formed to cover the color filter layer including the color filter parts 201 and the black matrix 202. Since the color filter parts 201 and the black matrix 202 are irregular in surface, the overcoat film 203 is formed to flatten the surface. The overcoat film 203 has formed thereon an alignment film 113 that determines the initial alignment of the liquid crystal layer. The alignment treatment for this alignment film 113 uses a rubbing method or an optical aligning method as used for the aforementioned alignment film 113 on the TFT substrate 100 side.

When electrostatic noise being high in voltage invades from outside into a TFT formed within a display region, the TFT is destroyed. If this occurs, the pixel becomes defect and hence, the liquid crystal panel becomes faulty. The same is true with TFTs formed in the scanning line drive circuit 40. The electrostatic protection circuit 50 shown in FIG. 1 is formed in order to protect the TFTs formed within the display region 90 or in the scanning line drive circuit 40 from the static electricity that invades from outside.

Figure 4:
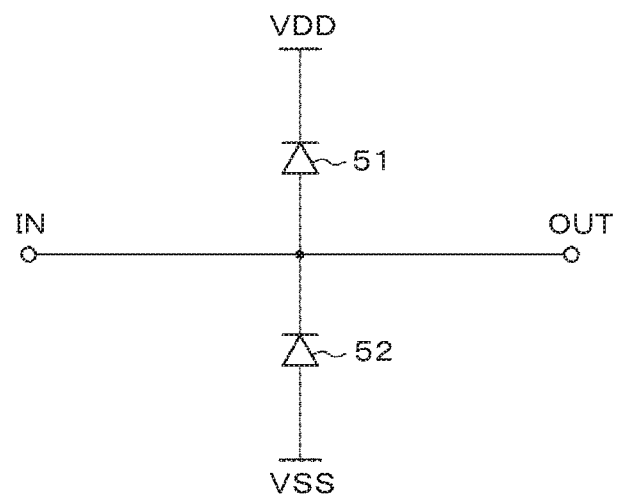
FIG. 4 is a diagram showing an example of an electrostatic protection circuit.

FIG. 4 is a basic circuit of an electrostatic protection circuit. The electrostatic protection circuit is configured by two diodes of a first diode 51 and a second diode 52. The electrostatic protection circuit shown in FIG. 4 is formed for each of terminals existing at the terminal section 80. The electrostatic protection circuit is provided with a terminal IN being an input terminal, a terminal OUT being an output terminal, a terminal VDD connected to a DC power source (high-voltage side) and a terminal VSS connected to a DC power source (low-voltage side). Specifically, the terminal IN being the input terminal is connected to an external input terminal side of the terminal section 80 being an invading route of static electricity. The terminal OUT being the output terminal is connected to the video signal line extending toward the display region 90 or to the scanning line drive circuit 40 side. Where the scanning line drive circuit 40 constituted by a shift register that operates under two power sources is formed outside the display region 90, the terminal VDD is connected to a high-voltage side of the shift register, while the terminal VSS is connected to a low-voltage side of the shift register. Incidentally, the terminal VDD is unable to have an AC signal inputted thereto and thus, should not have any video signal line connected thereto. Further, where the terminal VSS is set to the ground potential, the video signal is not outputted on the negative electrode side, and thus, the terminal VSS should not be connected to a part placed under the ground potential.

In FIG. 4, the diodes 51 and 52 usually do not operate because of having a reverse bias. Accordingly, the diodes 51 and 52 do not influence a normal operation. In FIG. 4, when a large positive surge current attributed to static electricity invades into the terminal IN, the first diode 51 operates, whereby the electric charge depending on the static electricity is discharged to the terminal VDD side. On the other hand, when a large negative surge current attributed to the static electricity invades into the terminal IN, the second diode 52 operates, whereby the electric charge depending on the static electricity is discharged to the terminal VSS side. Accordingly, it is possible to prevent the surge current attributed to the static electricity from invading into the display region 90 or the scanning line drive circuit 40.

Figure 5:
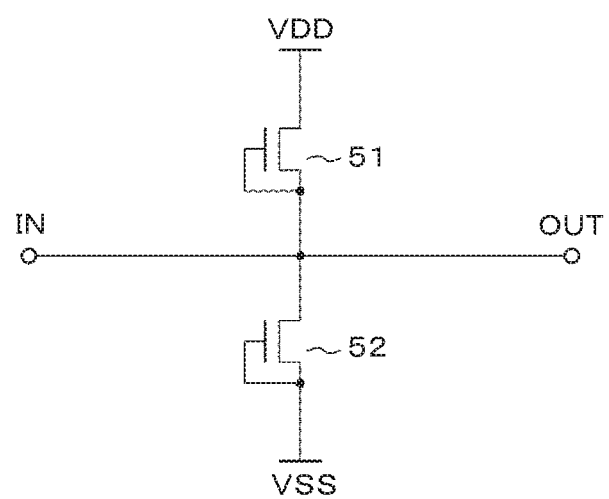
FIG. 5 is a diagram showing a configuration example of diodes shown in FIG. 4.

FIG. 5 shows an example of the protection diodes 51, 52 used in the liquid crystal display panel. In the liquid crystal display panel, the protection diodes 51, 52 are each configured to have a gate electrode of a TFT connected to a drain electrode or a source electrode through a semiconductor layer. The protection diodes 51, 52 are required to let a large electric current flow when operated by the invasion of a surge current. Therefore, it is necessary that the channel width of the TFT constituting the protection diodes 51, 52 be much larger than the channel width of the TFTs formed at pixels 25 in the display region 90 or formed in the scanning line drive circuit 40. That is, a wide area is required for the layout of the protection diodes 51, 52.

Figure 6:
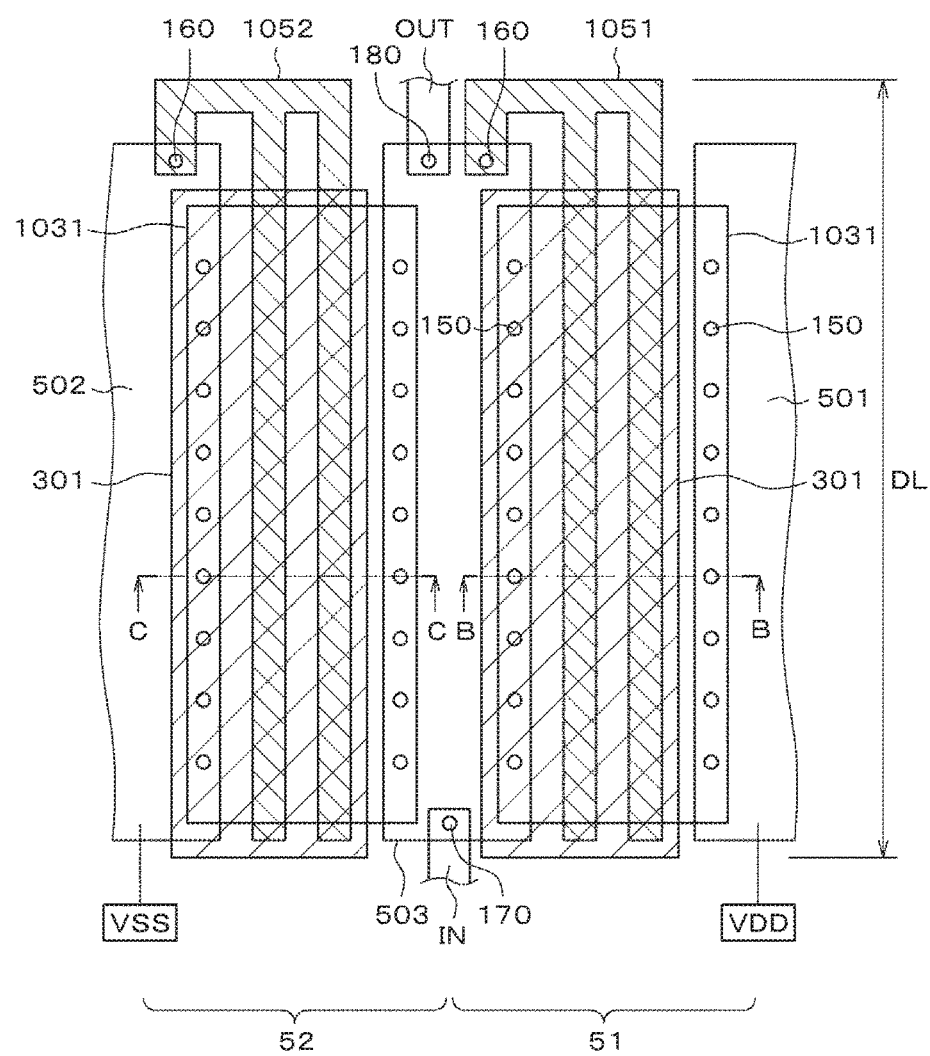
FIG. 6 is a plan view showing an example of a layout corresponding to the circuit shown in FIG. 5.

FIG. 6 shows a layout example of the electrostatic protection circuit 50 in the present invention. In FIG. 6, a wire IN corresponds to the terminal IN in FIG. 5, while a wire OUT corresponds to the terminal OUT in FIG. 5. A diode on the right side in FIG. 6 corresponds to the first diode 51 in FIG. 5, while a diode on the left side corresponds to the second diode 52 in FIG. 5. The first diode 51 and the second diode 52 are juxtaposed with a common SD (source drain) wire 503 therebetween. In FIG. 6, the common SD wire 503 is connected on the lower side to the wire IN through a through hole 170 and is connected on the upper side to the wire OUT through a through hole 180.

The first diode 51 on the right side is connected at a gate electrode 1051 of the TFT to the common SD wire 503 through a gate electrode through hole 160. The second diode 52 on the left side is connected at a gate electrode 1052 of the TFT to a SD wire 502 on the VSS side through a gate electrode through hole 160.

In the begging, description will be made regarding the configuration of the first diode 51 on the right side in FIG. 6. In the first diode 51 on the right side in FIG. 6, an SD wire 501 on the VDD side and a semiconductor layer 1031 are connected through many through holes 150. This is to enable a large surge current to flow. The same is true with the connection of the common SD wire 503 to the semiconductor layer 1031. In the first diode 51 on the right side, the gate electrode 1051 is placed to bifurcate between the common SD wire 503 on the wire IN side and the SD wire 501 on the VDD side and takes a double gate structure having two gate electrodes. This is to minimize leak current. The gate electrode 1051 is connected on the wire OUT side to the common SD wire 503 through the through hole 160. The second diode 52 on the left side in FIG. 6 takes the same structure as the first diode 51 on the right side except for a respect that a gate electrode 1052 is connected to the SD wire 502 on the VSS side through the through hole 160.

The role of the electrostatic protection circuit 50 is make it possible that before an electric charge attributed to static electricity which comes to invade into the wire IN side in FIG. 6 flows toward the wire OUT side, the first diode 51 or the second diode 52 discharges the electric charge to the VDD side or the VSS side. In order to let a large current flow, the first diode 51 and the second diode 52 are required to be increased in channel width. That is, the diodes 51, 52 shown in FIG. 6 are needed to be increased in the longitudinal dimension DL. In the prior art, for example, 1350 µm or so has been required as this dimension DL.

Electrostatic protection circuits like this have been formed outside a display region, that is, in a frame region, wherein it has been requested in recent years to make the width of the frame region narrow. In accordance with this trend, it has also been desired to decrease the electrostatic protection circuit in dimension. However, where the dimension DL indicated in FIG. 6 is decreased, the sensitivity of the electrostatic protection circuit goes down to become unable to perform a satisfactory protection function.

The present invention is designed so that a light shielding film 301 made of an electric conductor is arranged to extend to under the semiconductor layer 1031 on the SD wire 503 side, wherein the voltage invading into the SD wire 503 is induced also in the light shielding film 301 by a capacitive coupling, and thus, the light shielding film 301 can be used as a gate electrode. That is, the light shielding film 301 is used as a back gate. By so doing, the channel region has electric charges induced on the upper side and the lower side, so that it becomes possible to let a large current flow. Accordingly, even where the dimension DL of the diodes 51, 52 is made to be small, the sensitivity of the electrostatic protection circuit 50 can be prevented from going down. According to the present invention, a satisfactory function as the electrostatic protection circuit 50 can be accomplished even where the dimension DL is decreased to the half or so of that in the prior art.

In the first diode 51 on the right side in FIG. 6, the light shielding film 301 is continuously formed to be a flat shape under the gate electrode 1051 and the common SD wire 503. The light shielding film 301 is a conductive member made of the same material as the gate electrode 1051. For the purpose of shielding the channel region on the semiconductor layer 1031 against the light of the backlight, the light shielding film 301 suffices to be placed under the gate electrode 1051 only. However, in the present invention, by extending the light shielding film 301 to under the common SD wire 503, a large capacitive coupling is constituted between the light shielding film 301 and the semiconductor layer 1031. This makes the voltage at the common SD wire 503 induced also at the light shielding film 301, so that the light shielding film 301 can be used as a back gage. The feature of the first diode 51 on the right side in FIG. 6 resides in that the light shielding film 301 is made to extend to the common SD wire 503 side on the side where the gate electrode 1051 is connected.

Figure 7:
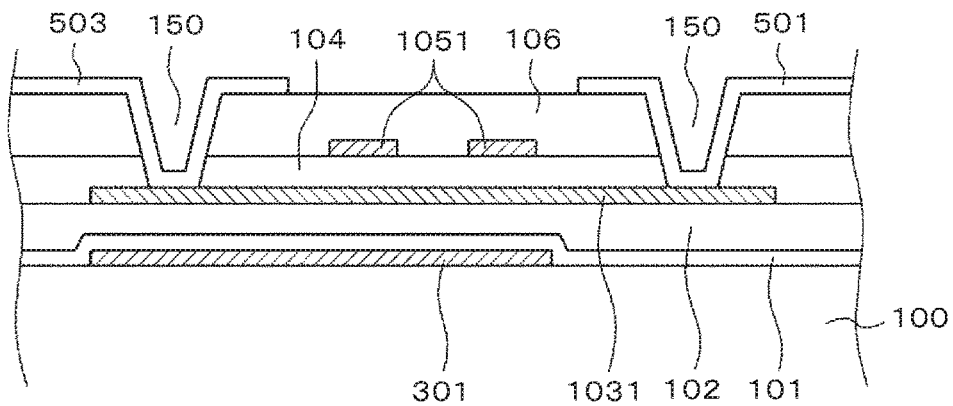
FIG. 7 is a sectional view taken along the line B-B in FIG. 6.

FIG. 7 is a sectional view taken along the line B-B of the first diode 51 on the right side in FIG. 6. FIG. 7 illustrates those layers only which are necessary for description. That is, layers that are on the upper side than the common SD wire 503 are omitted for simplicity. In FIG. 7, on the TFT substrate 100 made of glass, first of all, the light shielding film 301 is formed, on which the first backing film 101 and the second backing film 102 are formed. The semiconductor layer 1031 is formed on the second backing film 102. The semiconductor layer 1031 is connected to the common SD wire 503 and the SD wire 501 on the VDD side through the through holes 150 formed in the gate insulating film 104 and the interlayer insulating film 106.

On the semiconductor layer 1031, the gate electrode 1051 is arranged through the gate insulating film 104. The channel of the TFT is configured under the gate electrode 1051. In the display region 90, as shown in FIG. 3, the light shielding films 30 overlap with the channel regions only of the semiconductor layer 103. This is to prevent a stray capacitance from being formed between the light shielding films 30 and any other wire. However, in the electrostatic protection circuit of the present invention, as shown in FIG. 7, the light shielding film 301 is not only placed under the gate electrode 1051 but also is extended to under the common SD wire 503. Thus, as viewed in the plan view, the light shielding film 301 has a wider area than the semiconductor layer 1031, on the common SD wire 503 side, and the light shielding film 301 and the semiconductor layer 1031 have a wide overlapping region. This overlapping region becomes a parallel-plate capacitor. Although the light shielding film 301 is electrically floating, the semiconductor layer 1031 has an electrical potential applied from the through hole 150 and thus, if the capacitance at this overlapping region is charged, the light shielding film 301 also comes close to the same electrical potential. This capacitive coupling causes the light shielding film 301 to function as a back gate.

As a result, in an ON state, the semiconductor layer 1031 comes to be influenced by the gate electrode 1051 and the light shielding film 301 and hence, can let a large ON current flow. In short, it is possible to enhance the sensitivity of the electrostatic protection circuit 50. In FIG. 7, the feature resides in that the light shielding film 301 extends to the common SD wire 503 side that is on the side where the gate electrode 1051 is connected, as shown in FIG. 6. With this configuration, it can be accomplished to increase the ON current without changing a threshold voltage of the diode 51.

Incidentally, although the forming process becomes complicated, the light shielding film 301 may be formed to be electrically connected to the semiconductor layer 1031. In this case, even when a steep pulse is inputted to the terminal IN, no long time is taken for the charging between the semiconductor layer 1031 and the light shielding film 301, so that such formation of electrical connection make it possible to cope with the case that the capacitive coupling method cannot be cope with the problem.

The second diode 52 on the left side in FIG. 6 has similar configuration and operation. However, a difference resides in that the second diode 52 on the left side has the light shielding film 301 extended to under the SD wire 502 on the VSS side.

Figure 8:
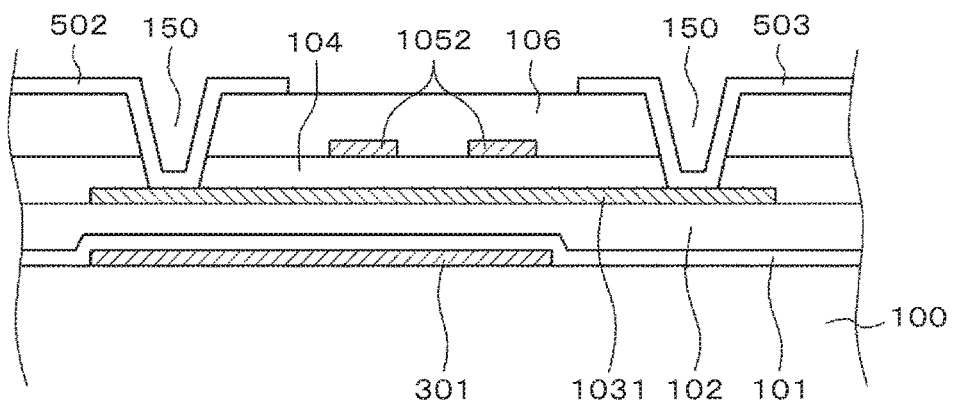
FIG. 8 is a sectional view taken along the line C-C in FIG. 6.

FIG. 8 is a sectional view taken along the line C-C of the second diode 52 on the left side in FIG. 6. The configuration shown in FIG. 8 is the same as that in FIG. 7 except that the semiconductor layer 1031 is connected to the common SD wire 503 on the terminal IN side and to the SD wire 502 on the VSS side. Then, in the configuration shown in FIG. 8, the light shielding film 301 extends to under the SD wire 502 on the VSS side. However, this is the same as the case of the first diode 51 in a respect that the light shielding film 301 extends to under the SD wire 502 to which the gate electrode 1052 is connected. The light shielding films 301 shown in FIG. 6 to FIG. 8 are formed using the same material and in the same layer as the light shielding film 30 in the pixel configuration within the display region 90 shown in FIG. 3. Therefore, forming the light shielding film 301 in the electrostatic protection circuit 50 can be done simultaneously with forming the light shielding film 30 in the pixel configuration within the display region 90 shown in FIG. 3.

Further, the layout of each TFT in FIG. 6 is linear. In an actual circuit, in order to make the dimension DL in FIG. 6 small, it may be the case that each TFT is formed by being bent or is formed by being divided into plural pieces and by juxtaposing these pieces. However, also in this modified case like this, the area the TFT occupies as a whole does not change. Accordingly, also in the case where like this each TFT is formed by being bent or is formed by being divided into plural pieces and by juxtaposing these pieces, it is possible by the application of the present invention to decrease the area occupied by the whole of the electrostatic protection circuit 50.

Although the foregoing description has been made taking the liquid crystal display device as an example, the electrostatic protection circuit 50 according to the present invention is also applicable to an organic EL display region.

What is claimed is:

1. A display device having a substrate and an electrostatic protection circuit formed on the substrate,
    the electrostatic protection circuit having a configuration, in which a first connection wire, a first diode, a third connection wire, a second diode, are a second connection wire are connected in series,
    a third connection wire having a first terminal and a second terminal; wherein
    the first diode has a first semiconductor layer, a first gate electrode and a conductive first light shielding film, the first gate electrode being connected to the third connection wire, the first light shielding film being formed, as viewed in a plan view, at a position where the first semiconductor layer and the first gate electrode overlap; and
    the second diode has a second semiconductor layer, a second gate electrode and a conductive second light shielding film, the second gate electrode being connected to the second connection wire, the second light shielding film being formed, as viewed in a plan view, at a position where the second semiconductor layer and the second gate electrode overlap.

2. The display device according to claim 1, wherein
    the first diode has, as viewed in a cross section view, a structure in which the first light shielding film is formed on the substrate, the first semiconductor layer is formed above the first light shielding film, and the first gate electrode layer is formed above the first semiconductor,
    the second diode has, as viewed in a cross section view, a structure in which the second light shielding film is formed on the substrate, the second semiconductor layer is formed above the second light shielding film, and the second gate electrode layer is formed above the second semiconductor.

3. The display device according to claim 1, wherein the first diode has, as viewed in a cross section view, a first insulating film is formed between the first light shielding film and the first semiconductor layer, a second insulating film is formed between the first semiconductor layer and the first gate electrode layer,
    the second diode has, as viewed in a cross section view, a first insulating film is formed between the second light shielding film and the second semiconductor layer, a second insulating film is formed between the second semiconductor layer and the second gate electrode layer.

4. The display device according to claim 1, wherein
a first power source voltage is applied to the first connection wire,
a second power source voltage is applied to the second connection wire,
the first power source voltage and the second power source voltage are supplied from DC power source voltages formed within a display region.

5. The display device according to claim 4, wherein:
the display device has a scanning line drive circuit having a shift register that operates under two power sources;
the first power source is common to a power source on a high-voltage side for the shift register; and
the second power source is common to a power source on a low-voltage side for the shift register.

6. The display device according to claim 1, wherein the first terminal is connected to a terminal to which a signal the display device acquires from outside is inputted.

7. The display device according to claim 1, wherein the second terminal is connected to a video signal line or a scanning line drive circuit.

8. The display device according to claim 1, wherein the light shielding film is formed using the same material as the gate electrode.

9. The display device according to claim 1, wherein:
the display device has a display region and a frame region around the display region; and
the electrostatic protection circuit is formed in the frame region.

10. The display device according to claim 1, wherein the display device is a liquid crystal display device.

11. The display device according to claim 1, wherein the display device is an organic EL display.

* * * * *